United States Patent
Hong et al.

(10) Patent No.: US 7,687,838 B2
(45) Date of Patent: Mar. 30, 2010

(54) RESISTIVE MEMORY DEVICE HAVING ARRAY OF PROBES AND METHOD OF MANUFACTURING THE RESISTIVE MEMORY DEVICE

(75) Inventors: Seung-bum Hong, Seongnam-si (KR); Ju-hwan Jung, Seoul (KR); Hyoung-soo Ko, Seoul (KR); Hong-sik Park, Seoul (KR); Dong-ki Min, Seoul (KR); Eun-sik Kim, Seoul (KR); Chul-min Park, Yongin-si (KR); Sung-dong Kim, Seongnam-si (KR); Kyoung-lock Baeck, Busan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 174 days.

(21) Appl. No.: 11/240,570

(22) Filed: Oct. 3, 2005

(65) Prior Publication Data
US 2006/0091437 A1    May 4, 2006

(30) Foreign Application Priority Data
Nov. 2, 2004    (KR)    .................. 10-2004-0088163

(51) Int. Cl.
*H01L 21/66* (2006.01)
*H01L 21/00* (2006.01)
*G11B 9/00* (2006.01)
*G11B 3/00* (2006.01)
*G11B 11/00* (2006.01)

(52) U.S. Cl. .................. 257/295; 257/414; 438/3; 369/126; 369/145; 369/13.01

(58) Field of Classification Search .......... 257/E21.663, 257/E21.208, E27.104, 295, 414; 438/3; 369/126, 145, 13.01
See application file for complete search history.

(56) References Cited

U.S. PATENT DOCUMENTS

| 4,157,932 A | | 6/1979 | Hirata |
| 5,146,299 A | * | 9/1992 | Lampe et al. ............... 257/295 |

(Continued)

FOREIGN PATENT DOCUMENTS

EP    1439546 A1    7/2004

(Continued)

*Primary Examiner*—David Vu
*Assistant Examiner*—Arman Khosraviani
(74) *Attorney, Agent, or Firm*—Sughrue Mion, PLLC

(57) ABSTRACT

Provided are a resistive memory device having a probe array and a method of manufacturing the same. The resistive memory device includes a memory part having a bottom electrode and a ferroelectric layer sequentially formed on a first substrate; a probe part having an array of resistive probes arranged on a second substrate, with the tips of the resistive probes facing the ferroelectric layer so as to write and read data on the ferroelectric layer; and a binding layer which grabs and fixes the resistive probes on or above the ferroelectric layer. The method of manufacturing the resistive memory device includes forming a bottom electrode and a ferroelectric layer sequentially on a first substrate; forming an array of resistive probes on a second substrate; and wafer level bonding the first substrate to the second substrate using a binding layer such that tips of the resistive probes face the ferroelectric layer.

6 Claims, 15 Drawing Sheets

U.S. PATENT DOCUMENTS

| | | | | |
|---|---|---|---|---|
| 5,468,684 | A * | 11/1995 | Yoshimori et al. | 438/3 |
| 5,519,234 | A * | 5/1996 | Paz de Araujo et al. | 257/295 |
| 5,719,416 | A * | 2/1998 | Yoshimori et al. | 257/295 |
| 6,025,618 | A * | 2/2000 | Chen | 257/295 |
| 6,080,592 | A * | 6/2000 | Paz de Araujo et al. | 438/3 |
| 6,373,743 | B1 * | 4/2002 | Chen et al. | 365/145 |
| 7,173,842 | B2 * | 2/2007 | Isenberger et al. | 365/145 |
| 7,187,575 | B2 * | 3/2007 | Kijima et al. | 365/145 |
| 2002/0001219 | A1 * | 1/2002 | Forbes et al. | 365/145 |
| 2004/0129987 | A1 * | 7/2004 | Uchiyama et al. | 257/395 |
| 2004/0209420 | A1 * | 10/2004 | Ljungcrantz et al. | 438/239 |
| 2004/0214352 | A1 * | 10/2004 | Kijima et al. | 438/3 |
| 2004/0235259 | A1 * | 11/2004 | Celii et al. | 438/396 |
| 2004/0245547 | A1 * | 12/2004 | Stipe | 257/200 |
| 2005/0094430 | A1 * | 5/2005 | Nauka et al. | 365/151 |
| 2005/0145908 | A1 * | 7/2005 | Moise et al. | 257/295 |

FOREIGN PATENT DOCUMENTS

| | | |
|---|---|---|
| JP | 9-503622 A | 4/1997 |
| JP | 11-224867 A | 8/1999 |
| JP | 2003-204095 A | 7/2003 |
| WO | 03096409 A1 | 11/2003 |
| WO | WO 03096409 A1 * | 11/2003 |

* cited by examiner

RESISTIVE MEMORY DEVICE HAVING ARRAY OF PROBES AND METHOD OF MANUFACTURING THE RESISTIVE MEMORY DEVICE

BACKGROUND OF THE INVENTION

This application claims priority from Korean Patent Application No. 10-2004-0088163, filed on Nov. 2, 2004, in the Korean Intellectual Property Office, the disclosure of which is incorporated herein in its entirety by reference.

1. Field of the Invention

The present invention relates to a memory device and a method of manufacturing the memory device and, more particularly, to a resistive memory device having a multi-probe array and a method of manufacturing the resistive memory device.

2. Description of the Related Art

The growing popularity of portable electronic products, such as portable communication terminals and digital cameras, demands ever more highly integrated memory devices and high capacity recording devices. Such memory devices in portable electronic products need high density writing and reading and good shock and wear resistance.

However, conventional devices in the form of hard disks cannot easily be made small, and non-volatile memory devices such as FeRAM devices cannot be highly integrated. Thus, developments of new memory devices, such as MRAM devices, are suggested.

Recording devices have been tried using a technique of detecting charge distribution on the surface of a recording layer by scanning probes. It is expected that these recording or memory devices using the probes can write data at a higher density than FeRAM or similar devices. However, the structures of the scanning probes make these recording devices relatively weak against shock and wear.

SUMMARY OF THE INVENTION

The present invention provides a memory device which can write and read data at high density while possessing the shock and wear resistance needed for the environment of portable electronic products, and a method of manufacturing the memory device.

According to an aspect of the present invention, there is provided a resistive memory device in which a ferroelectric layer is used as a memory layer, and resistive probes face the memory layer and write and read data on the memory layer. The resistive memory device comprises: a memory part having a bottom electrode and a ferroelectric layer sequentially formed on a first substrate; a probe part having an array of resistive probes arranged on a second substrate, the resistive probes comprising tips which face the ferroelectric layer such that they can write and read data on the ferroelectric layer; and a binding layer which grabs and fixes the resistive probes on or above the ferroelectric layer.

According to another aspect of the present invention, there is provided a method of manufacturing a resistive memory device, comprising: forming a bottom electrode and a ferroelectric layer sequentially on a first substrate; forming an array of resistive probes for writing and reading data, on a second substrate; and wafer level bonding the first substrate to the second substrate using a binding layer such that tips of the resistive probes face the surface of the ferroelectric layer.

Each of the resistive probes may comprise a resistive region at the tip, the resistance of which changes according to the direction of remnant polarization in a domain of the ferroelectric layer corresponding to the tip; and a first electrode region and a second electrode region, which are separated from each other on inclined surfaces of the probe and have the resistive region interposed therebetween, the first and the second electrode regions being used to detect the resistance of the resistive region when reading data.

For example, each of the resistive probes may have a body in the shape of a cone or a polygonal cone, containing silicon doped with a first impurity, and the first and the second electrode regions may comprise regions doped with a second impurity of the opposite conduction type to the first impurity, on the separated inclined surfaces. The resistive region may comprise a region doped with the second impurity at a lower concentration than the first and second electrode regions.

The probe part may further comprise interconnections which are respectively connected to the first and second electrode regions, are formed behind the probe array, and function as terminals for selecting one of the resistive probes and applying a current to the selected resistive probe. The probe part may further comprise bit lines which are respectively connected to the first and second electrode regions and formed behind the probe array; and selection transistors which control the application of a current to the bit lines.

In the above method, forming the resistive probe array may comprise: forming a silicon layer doped with a first impurity on the second substrate; ion-implanting a second impurity, which has the opposite conduction type to the first impurity, into at least two adjacent portions in the silicon layer to form regions of the second impurity; diffusing the ion-implanted second impurity from the regions of the second impurity to form a diffusion region of the second impurity between the regions of the second impurity, the diffusion region containing a lower concentration of the second impurity than the regions of the second impurity; forming tip masks covering the diffusion region; and isotropically etching portions of the silicon layer which are exposed through the tip masks, to form the resistive probes.

In this case, each of the resistive probes may be formed by isotropic etching such that its tip is positioned at the diffusion region of the second impurity and first and the second electrode regions are respectively positioned at the regions of the second impurity.

The bonding the first substrate to the second substrate may comprise forming a binding layer comprising a polymer layer on the ferroelectric layer; penetrating the tips of the resistive probes into the polymer layer; and curing the polymer layer to grab and fix the resistive probes.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Figure 1:
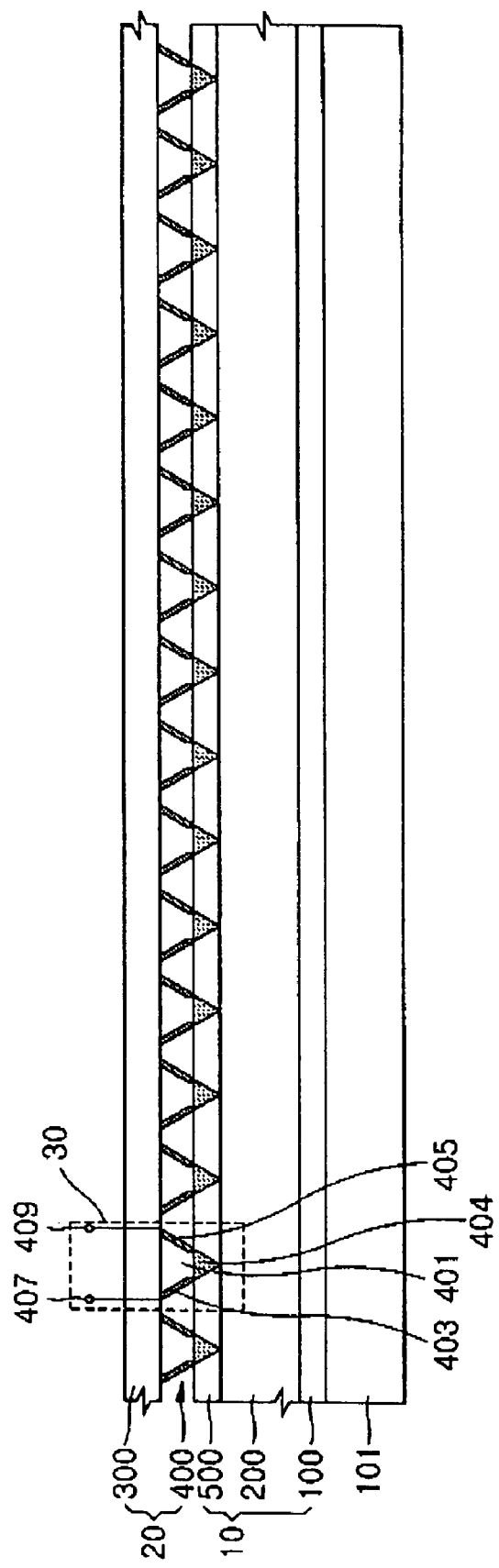
FIG. 1 is a schematic cross-sectional view of a memory device according to an exemplary embodiment of the present invention.

Hereinafter, exemplary embodiments of the present invention will be described in more detail with reference to the attached drawings. However, these embodiments may be changed in form and are not intended to limit the scope of the invention. It should be understood that these embodiments are given to illustrate fully the present invention to those of ordinary skill in the art.

In an embodiment of the present invention, there is provided a resistive memory device in which a ferroelectric layer is used as a memory layer, to which resistive probes are matched, and writing and reading on the memory layer is realized using the resistive probes.

Each of the resistive probes may comprise a resistive region at its tip and two electrode regions which are separated from each other, on inclined surfaces adjacent to the tip, having the resistive region interposed therebetween. For example, each of the resistive probes may have the shape of a cone, a tetragonal cone, or a polygonal cone, with a pointed tip, and may comprise the two electrode regions which are separated from each other on the inclined surfaces of the probe body and doped with impurity, and have the resistive region interposed therebetween. In this case, the probe body may be doped with a first impurity, and the electrode regions doped with a second impurity of the opposite conduction type.

The resistive region at the tip between the two electrode regions may comprise an impurity region doped with the second impurity at a lower concentration than the two electrode regions, or a region doped with the first impurity which has the opposite conduction type to the second impurity with which the electrode regions are doped. The charge distribution on the surface of the memory layer which faces the tip generates an electric field which in turn generates a depletion layer, and this affects the resistance of the resistive region.

The charge distribution on the surface of the memory layer is changed according to the direction of remnant polarization in the domain of a ferroelectric layer used as the memory layer. For example, the direction of the electric field which acts on the tip may be reversed according to the remnant polarization. Thus, according to the remnant polarization, the depletion layer may or may not form in the resistive region comprising the tip. The electrical resistance of the resistive region, i.e. the resistance between the two electrode regions, changes depending on whether or not the depletion layer is generated. A memory device can be realized by setting two states of the resistance values to "0" and "1". The remnant polarization state of the ferroelectric layer can be changed for each domain of the ferroelectric layer, and thus, the minimum memory region recorded on the ferroelectric layer can be greatly reduced according to the size of the domain. Thus, a very high writing density can be realized.

When a voltage of at least a coercive voltage of the remnant polarization of a domain, or an electric field of at least a coercive field, is applied to the tip of the probe, the direction of polarization in the domain of the ferroelectric layer corresponding to the tip can be reversed. Thus, data can be written on the ferroelectric layer using the probe.

In an embodiment of the present invention, an array of the probes are introduced in the ferroelectric layer, and thus, the ferroelectric layer and one probe can comprise a memory cell. Thus, writing and reading of data on the ferroelectric layer can be performed separately in each memory cell. An interconnection structure which comprises selection transistor devices for selecting a memory cell, bit lines and word lines, and interconnection contacts is substantially located over the memory cells, i.e., behind the probes, and thus, the data can be selectively written and read by selecting individual memory cells.

FIG. 1 is a schematic cross-sectional view of a memory device according to an embodiment of the present invention. Referring to FIG. 1, the memory device is formed by binding a memory part 10 to a probe part 20 using a binding layer 500.

The memory part 10 comprises a bottom electrode 100 formed on a wafer or a first substrate 101 and a ferroelectric layer 200 as a memory layer formed on the bottom electrode 100. The ferroelectric layer 200 has a vertical dielectric polarization direction, and may be made of a ferroelectric material such as PZT, BTO($BaTiO_3$), or similar. The bottom electrode 100 is formed to apply an electric field to the ferroelectric layer 200 or for grounding.

After the formation of the ferroelectric layer 200, the binding layer 500 for wafer level bonding on the ferroelectric layer 200 is formed. The binding layer 500 is introduced to grab and fix the probes on the ferroelectric layer 200 in a subsequent process. The binding layer 500 is formed such that the probes can relatively easily penetrate into it, and can then be cured in a relatively simple manner by a thermal process, UV light irradiation or similar, to grab and fix the probes on or above the ferroelectric layer 200. The binding layer 500 may be made of an adhesive resin or a polymer or polymer-like material The probe part 20 comprises an array of probes 400 formed on a wafer or a second substrate 300. Tips of probes 400 are bound to the memory part 10 to face the surface of the ferroelectric layer 200. The array of probes 400 corresponds to an array of memory cells 30. Each of the probes 400 has a body 401 in a pointed shape. The body 401 is made of a semiconductor material and may have the shape of a cone, a tetragonal cone, or a polygonal cone.

Each of the probes 400 can be composed of a resistive semiconductor probe. For example, each of the probes 400 comprises a resistive region 404 at the tip of the body 401, and two electrode regions 403 and 405 separated from each other on the left and right inclined surfaces with a resistive region 404 interposed therebetween. In this case, the body 401 may be made of a semiconductor material, for example, silicon. The two electrode regions 403 and 405 may be doped with an n-type or p-type impurity. In this case, the body 401 may be doped with an impurity of the opposite conduction type to the two electrode regions 403 and 405.

The tip of the body 401 between the two electrode regions 403 and 405 is assigned as the resistive region 404 and may have a higher resistance than the two electrode regions 403 and 405. For example, when the two electrode regions 403 and 405 are $n^+$-type doped, the resistive region 404 may be $n^-$-type doped. At this time, the body 401 may be p-type doped.

Then, the resulting probe part 20 is bound to the memory part 10 such that the tips of the probes 400 face the surface of the ferroelectric layer 200. The bonding is performed using wafer level bonding in which a wafer is bound to another wafer. During the wafer level bonding, the tips of the probes 400 penetrate into the binding layer 500 formed on the ferroelectric layer 200 of the memory part 10, and are thus stuck into the binding layer 500. Then, the polymer of the binding layer 500 is cured to fix the probes 400. Thus, the array of the probes 400 on the second substrate 300 are arranged such that the tips of the probes 400 face the ferroelectric layer 200.

The binding layer 500 may function as an insulating layer, and simultaneously shield the ferroelectric layer 200 from charged particles and atmospheric humidity. Since the ferroelectric layer 200 is formed on a separate wafer or substrate from the probe part 20, the ferroelectric layer 200 can be deposited at a higher temperature, and thus its properties can be improved. In general, when the ferroelectric layer 200 and the sensor part, for example, the probes 400, are formed simultaneously, doping regions of the probes 400 are likely to be adversely effected by the high temperature, and thus, the deposition temperature of the ferroelectric layer 200 is greatly limited. The embodiment of the present invention overcomes this temperature limitation for the deposition of the ferroelectric layer 200.

In the resistive memory device according to an embodiment of the present invention, the selection and operation of one of the memory cells 30 may be performed by applying a predetermined voltage to two terminals 407 and 409 which are electrically connected to the two electrode regions 403 and 405 of the probes 400, respectively. The bottom electrode 100 on the bottom surface of the ferroelectric layer 200 may be grounded. The two electrode regions 403 and 405 are electrically connected to the interconnections, such as bit lines, to apply the necessary voltages to the probes 400 to select the memory cells 30, write data to the memory cells 30, and read data from the memory cells 30. For example, an interconnection structure in which word lines and bit lines intersect to form a matrix (not shown) is buried in the second substrate 300 which is behind the array of the probes 400, as in the conventional memory devices, and the first terminal 407 is connected to one of the word lines and the second terminal 409 is connected to one of the bit lines, thus performing the selection of one of the memory cells 30, writing data to the memory cell 30, and reading data from the memory cell 30.

The basic operation concept of the resistive memory device according to an embodiment of the present invention will now be described.

Figure 2:
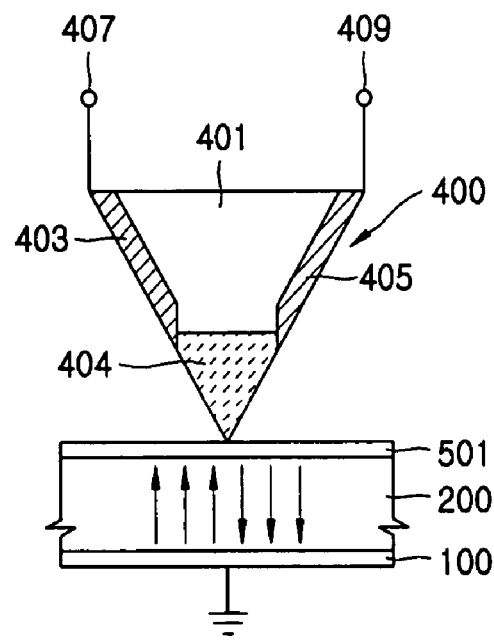
FIGS. 2 through 4 are views for explaining the structure and operation of a memory cell in a resistive memory device according to an exemplary embodiment of the present invention.
Figure 3:
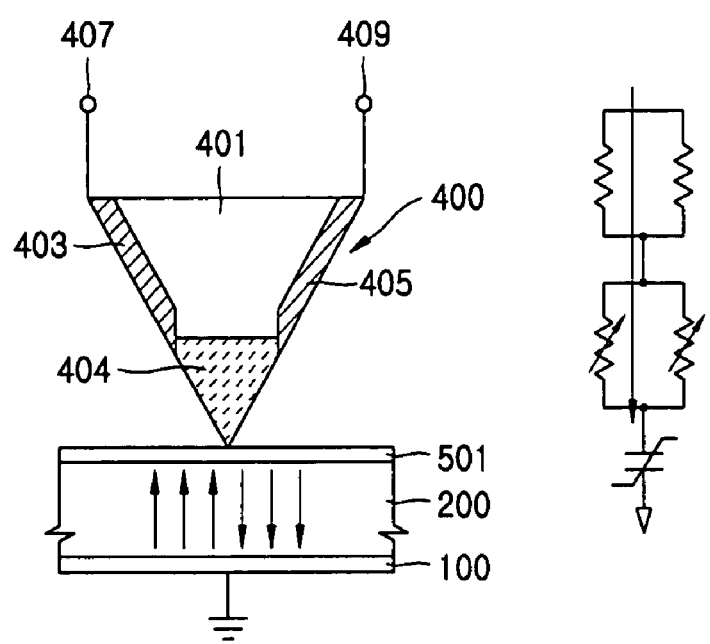
Figure 4:
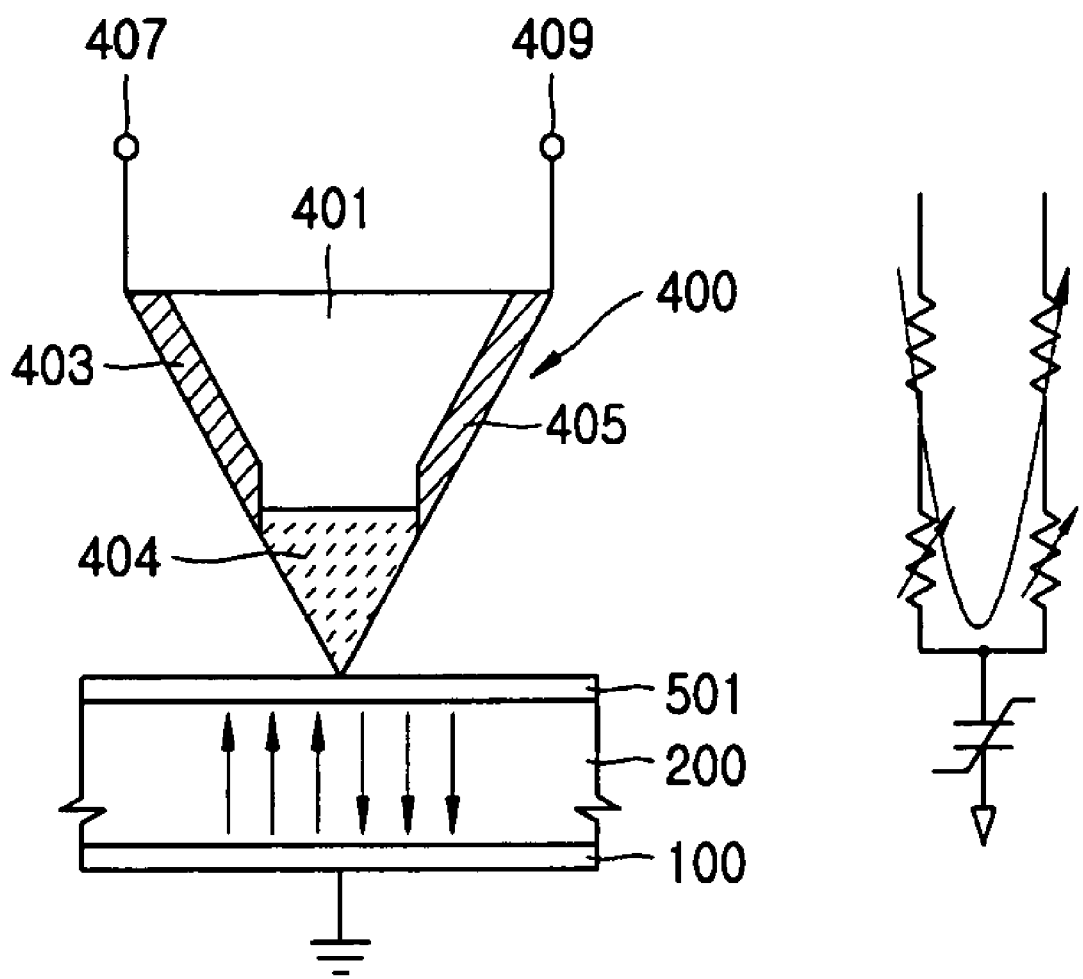

FIG. 2 is a schematic view for explaining the cell structure in a resistive memory device according to an embodiment of the present invention. FIG. 3 is a schematic view for explaining writing data to a cell in a resistive memory device according to an embodiment of the present invention. FIG. 4 is a schematic view for explaining reading data from a cell in a resistive memory device according to an embodiment of the present invention.

Referring to FIG. 2, a probe 400 writes and reads data using the difference in an electric field according to dielectric polarization generated in a domain of a ferroelectric layer 200. For this, the probe 400 comprises a resistive region 404 at its tip, between a first electrode region 403 and a second electrode region 405. The resistive region 404 is fixed in a binding layer 500 of FIG. 1 and contacts or is very close to the surface of the ferroelectric layer 200. A protective layer 501 may be further formed on the ferroelectric layer 200.

A depletion layer may be generated in the resistive region 404 at the tip due to the effects of the electric field, which varies according to the dielectric polarization in the ferroelectric layer 200 facing the tip. As a result, the resistance between the first and the second electrode regions 403 and 405 is recognized as one of the two states "0" and "1".

Referring to FIG. 3, the data is written to a specific domain region of the ferroelectric layer 200 by generating a dielectric polarization in a specific direction in a portion of the ferroelectric layer 200 which faces the resistive region 404. For this, voltages of the same polarity are simultaneously applied to the first and second electrode regions 403 and 405. At this time, at least the voltage required to change the direction of the dielectric polarization, i.e., a coercive voltage (Vc), must be applied to the first and the second electrode regions 403 and 405. In this case, at least the electric field required to change the direction of the dielectric polarization, i.e., a coercive electric field ($E_c$), is generated between the grounded bottom electrode 100 and the tip of the probe 400. Thus, vertical dielectric polarization is generated in the domain region of the ferroelectric layer 200 facing the tip of the probe 400. Voltages for writing are applied to the first and the second electrode regions 403 and 405 through the two terminals 407 and 409, and according to the polarity of the applied voltage, the direction of polarization in a domain of the ferroelectric layer 200 is reversed.

Referring to FIG. 4, when different voltages are applied to the two terminals 407 and 409, if the direction of alignment of the domain of the ferroelectric layer 200 is upward, the resistance of the resistive region 404 is relatively low, and thus, a relatively large current flows through the resistive region 404. In this case, for example, the resistive region 404 is $n^-$-type doped and the first and the second electrode regions 403 and 405 are $n^+$-type doped. On the other hand, if the direction of alignment of the domain is downward, a depletion layer is generated in the resistive region 404 due to the effects of the electric field according to the remnant polarization. Thus, the resistance of the resistive region 404 is high, and thus, a small current flows through the resistive region 404. Data of "0" and "1" can be read using the two current states, i.e., the higher current and the lower current.

Again, referring to FIG. 1, to select one of the memory cells 30 and apply a voltage to the probes 400 for selecting one of the memory cells 30 and writing and reading data on the memory cells 30, the interconnection structure may be formed in the second substrate 300 behind the array of probes 400. The interconnection structure may be constructed such that word lines intersect with bit lines to connect specific wires to the two terminals 407 and 409 of each of the probes 400. Alternatively, the interconnection structure may be constructed such that each of the word lines intersects two parallel bit lines, and a selection transistor is connected to the word line. The process of forming the probes 400 will be explained based on the example in which the interconnection structure accompanied by selection transistors is installed in the second substrate 300.

FIGS. 5 through 14 are schematic plan views for explaining the process of forming an array of probes in a resistive memory device according to an embodiment of the present invention. FIGS. 15 through 18 are schematic cross-sectional views for explaining the process of forming an array of probes in a resistive memory device according to an embodiment of the present invention.

Figure 5:
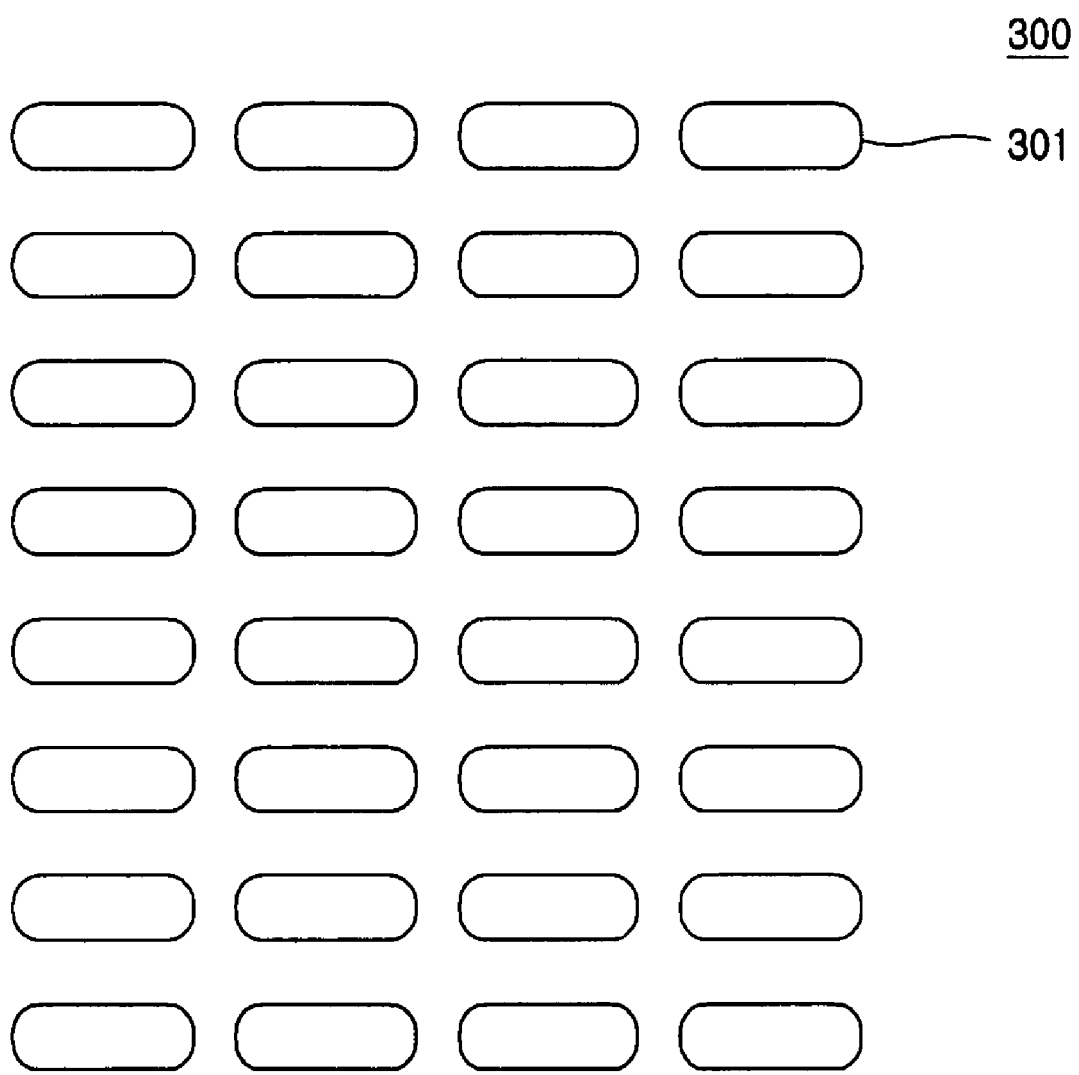
FIG. 5 through 14 are schematic plan views for explaining the process of forming an array of probes used in a resistive memory device according to an exemplary embodiment of the present invention.
Figure 6:
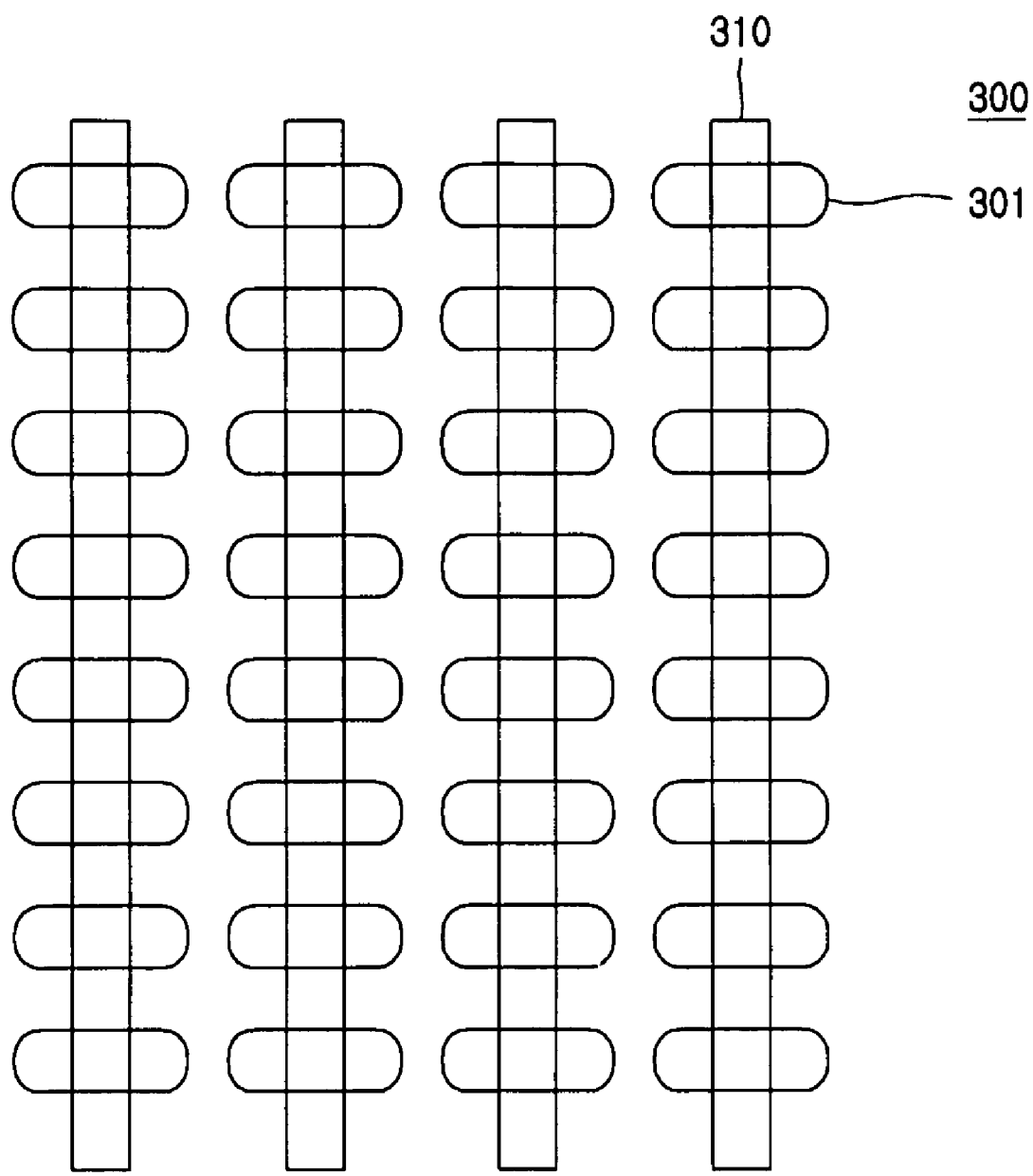

Referring to FIG. 5, active regions 301 are assigned on a second substrate 300, which is a semiconductor substrate made of silicon (Si), using a device separation process from a method of forming transistors. Referring to FIG. 6, word lines 310 are formed to cross the active regions 301 using a process of forming transistor gates. The word lines 310 are made of a polycrystalline silicon or other suitable material. A gate oxide layer (not shown) may be formed between the active regions 301 and the word lines 310. Thus, selection transistors for selecting a probe 400 are formed.

Figure 7:
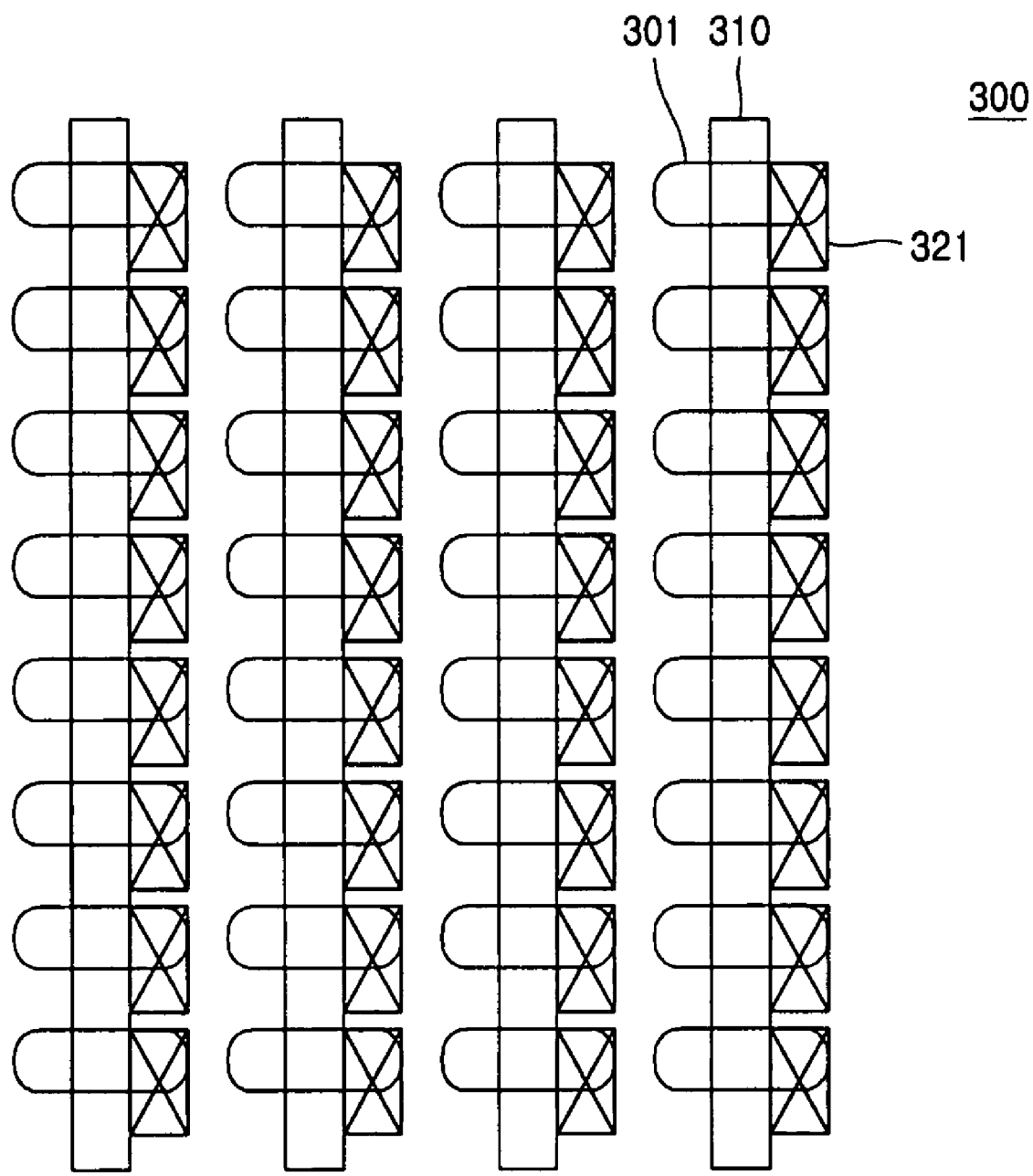
Figure 8:
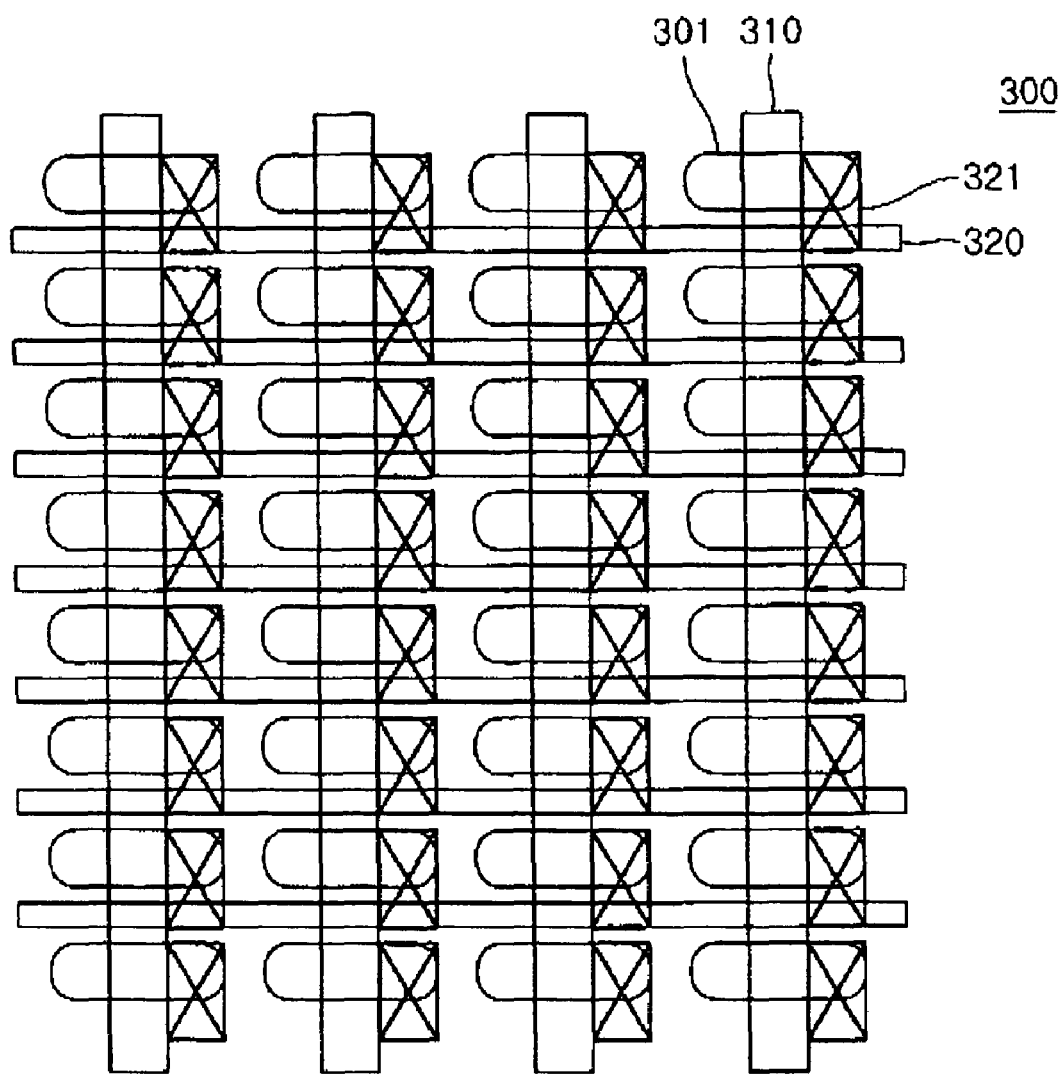

Referring to FIG. 7, bit line plugs 321 are formed near the word lines 310 to be electrically connected to adjacent active regions 301. An insulating layer (not shown) is formed to cover the word lines 310, and the bit line plugs 321, which are conductive, are electrically connected to the active regions 301 through the insulating layer. Referring to FIG. 8, conductive bit lines 320 are formed to intersect the word lines 310. The bit lines 320 are electrically connected to the bit line plugs 321. The bit lines 320 and the word lines 310 intersect to form a matrix.

Figure 9:
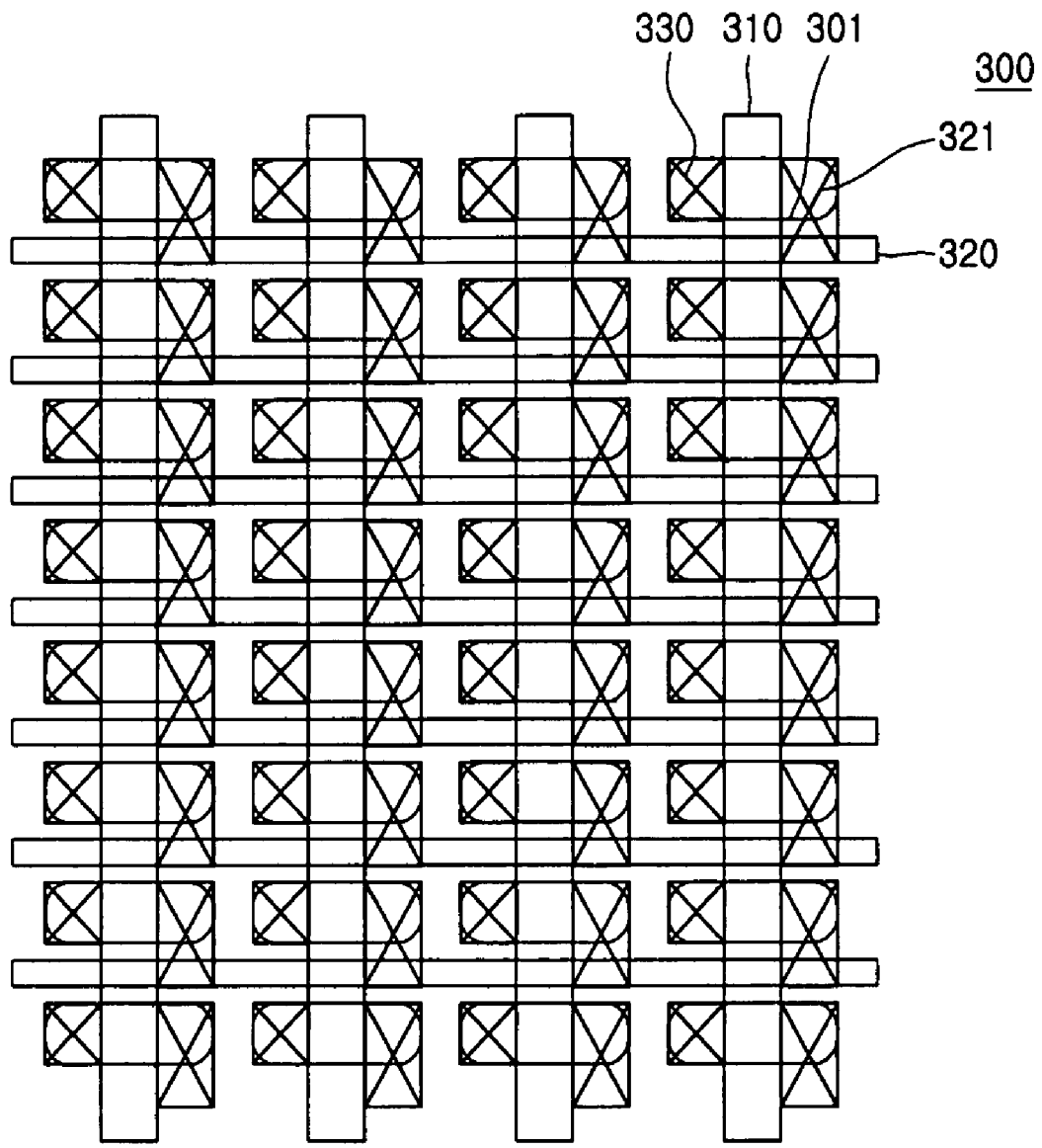

Referring to FIG. 9, conductive cell plugs 330 are formed to pass through the second substrate 300 in the vicinity of the bit lines 320 and the word lines 310 such that the cell plugs 330 are electrically connected to the active regions 301. The cell plugs 330 contact the active regions 301 through an insulating layer covering the bit lines 320 and the insulating layer covering the word lines 310. Thus, an interconnection structure is formed for selecting individual memory cells 30 and writing and reading data on the memory cells 30 (see FIG. 1).

Figure 10:
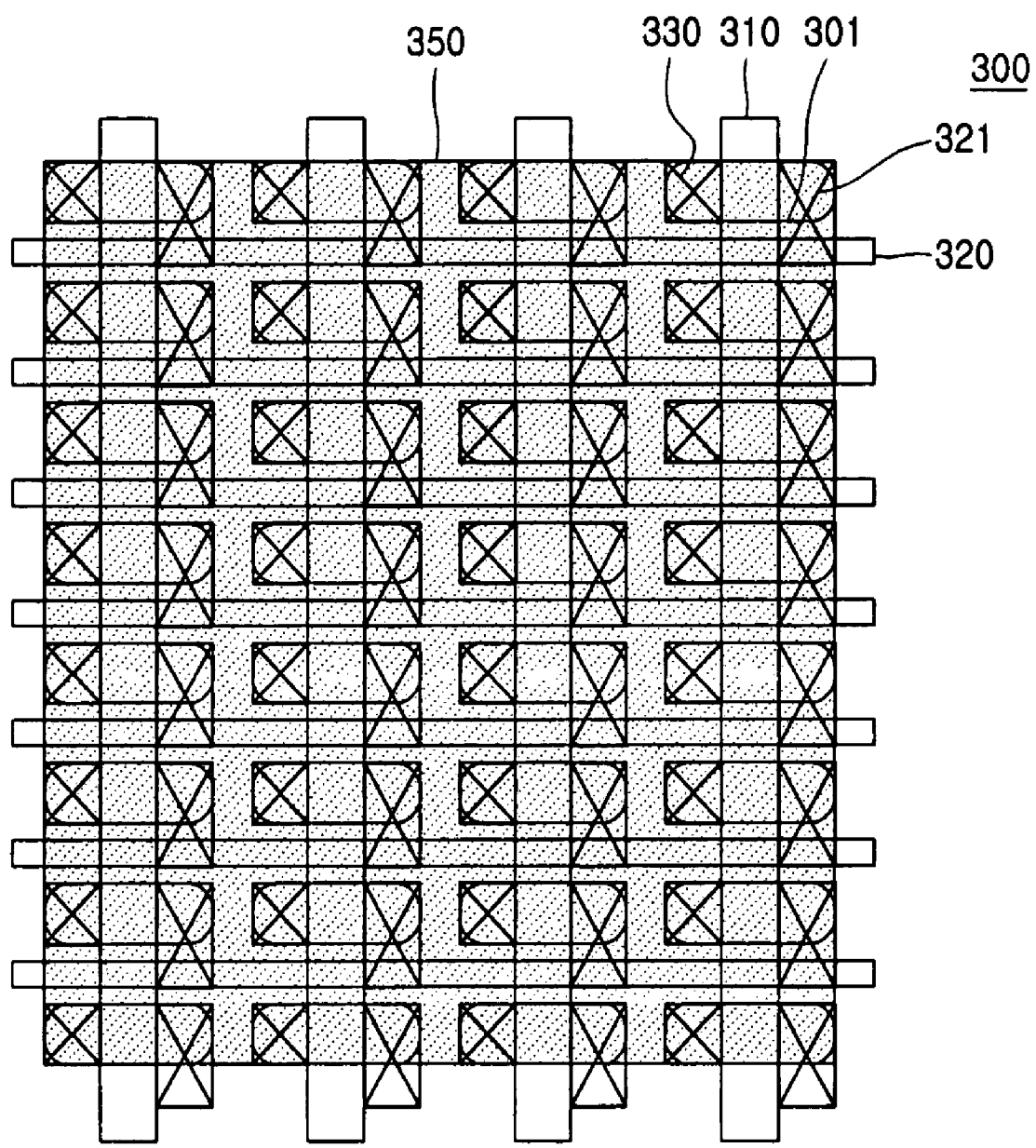
Figure 11:
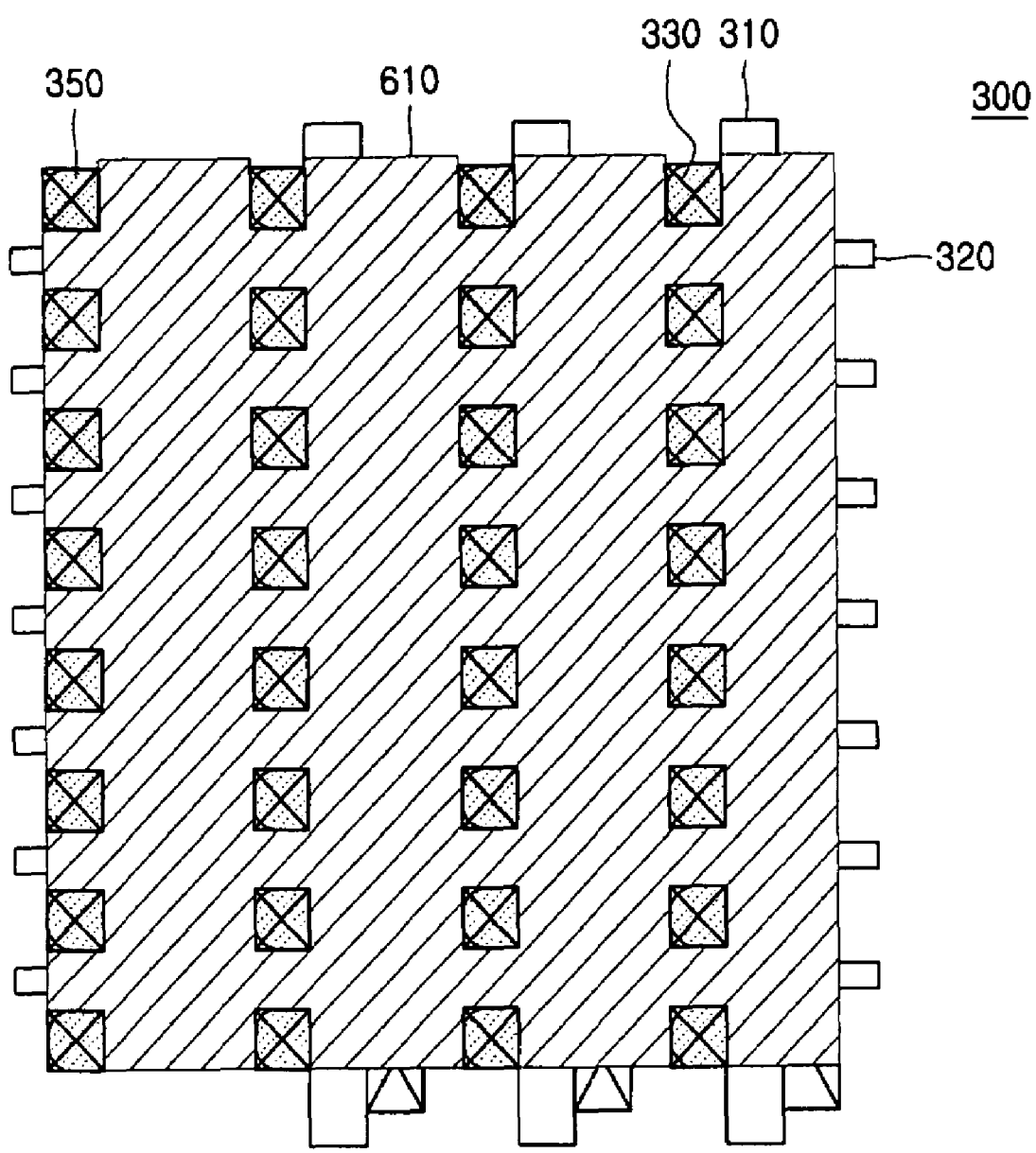

Referring to FIG. 10, a silicon layer 350 is formed on the second substrate 300 which has the cell plugs 330 formed thereon. The silicon layer 350 may be formed by deposition. The silicon layer 350 may be doped with an impurity of the opposite conduction type to that of the two electrode regions 403 and 405 of the probes 400 (see FIG. 1). For example, the silicon layer 350 may be doped with a p-type impurity.

Referring to FIGS. 11 through 15, a mask 610 for ion implantation is formed on the silicon layer 350. The mask 610 exposes portions of the silicon layer 350 above the cell plugs 330. Impurity regions 640 are formed in the exposed portions of the silicon layer 350 by the ion implantation. The impurity may be n-type. As a result, the impurity regions 640 are electrically connected to the cell plugs 330.

Figure 12:
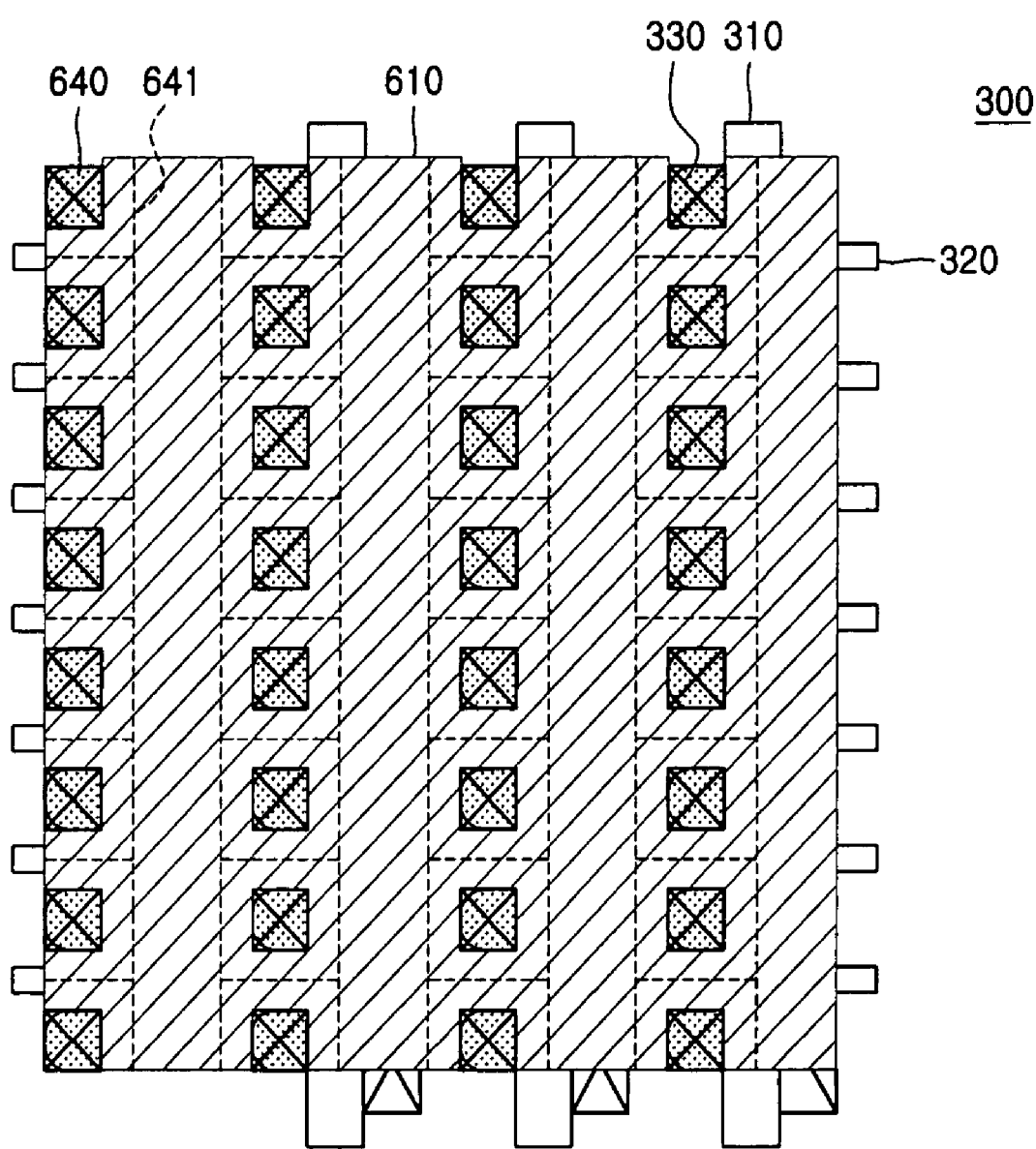
Figure 16:
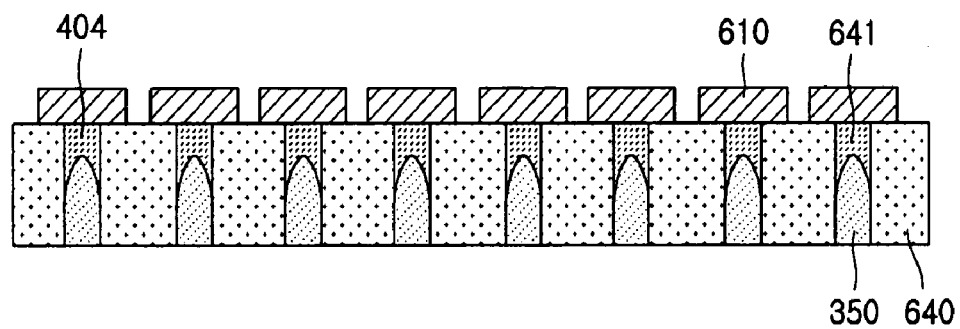

Referring to FIGS. 12 and 16, the impurity is diffused from the impurity regions 640 to form impurity diffusion regions 641 having a lower concentration of the impurity than the impurity regions 640. The diffusion of the impurity is controlled such that the impurities diffused from adjacent impurity regions 640 meet in the middle and overlap each other, that is, the diffusion profile is controlled such that both the impurity diffusion regions 641 meet near the surface of the silicon layer 350 below the mask 610, and the silicon layer 350 is present below the overlapping impurity diffusion regions 641. In general, the diffusion rate of the impurity in portions adjacent to the surfaces of the impurity diffusion regions 641 is faster than below such portions. Thus, the diffusion profile of the impurity may be formed such that the surface of the silicon layer 350 has a convex form as illustrated in FIG. 16.

Figure 13:
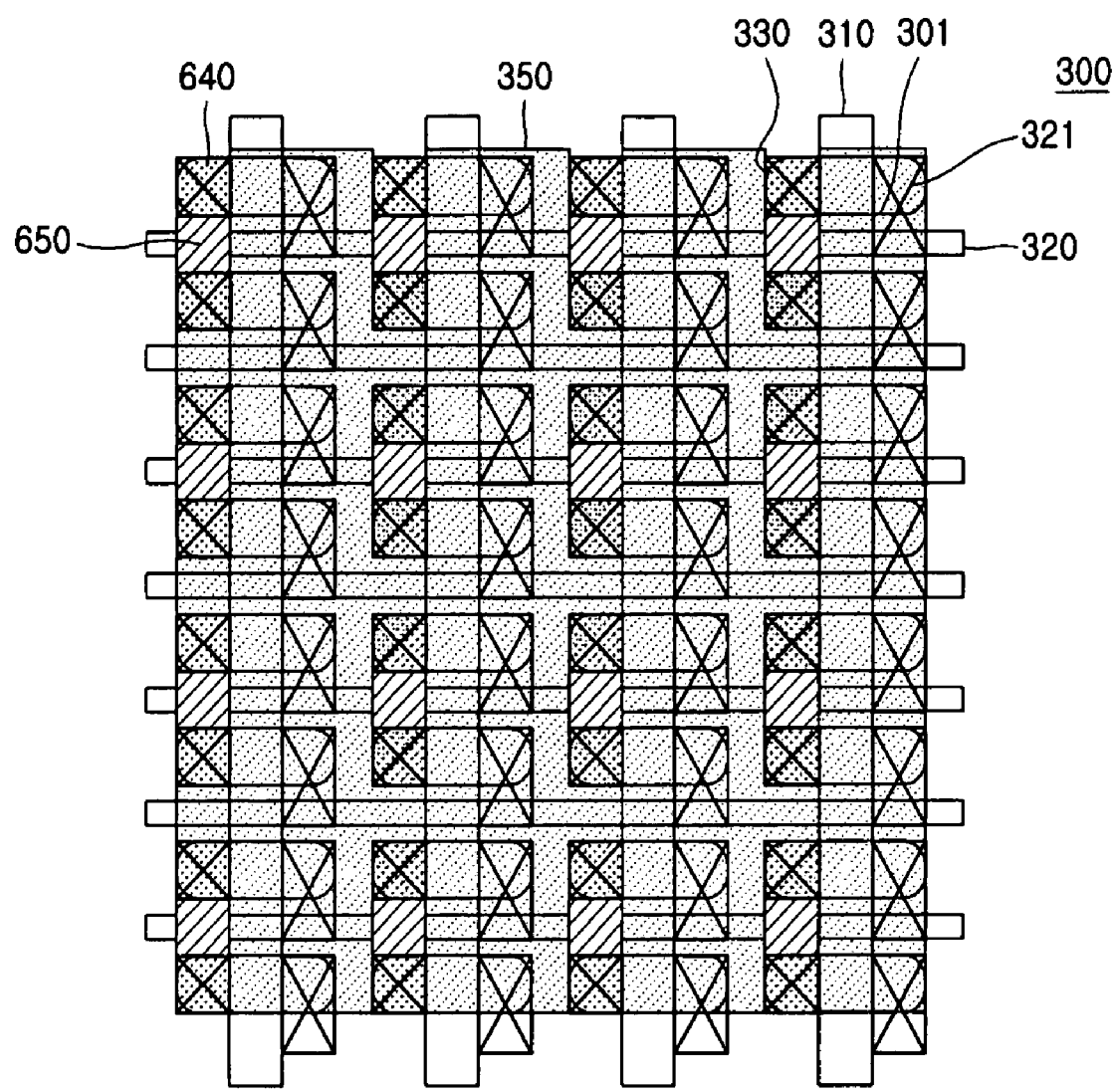

Referring to FIG. 13, tip masks 650 are used to etch the silicon layer 350 for forming the probes 400 (see FIG. 1). The tip masks 650, are hard masks, and are formed to cover the silicon layer 350 above portions between the cell plugs 330, i.e., to cover portions between the impurity regions 640. The tip masks 650 are formed to cover portions in which the probes 400 are to be formed.

Figure 14:
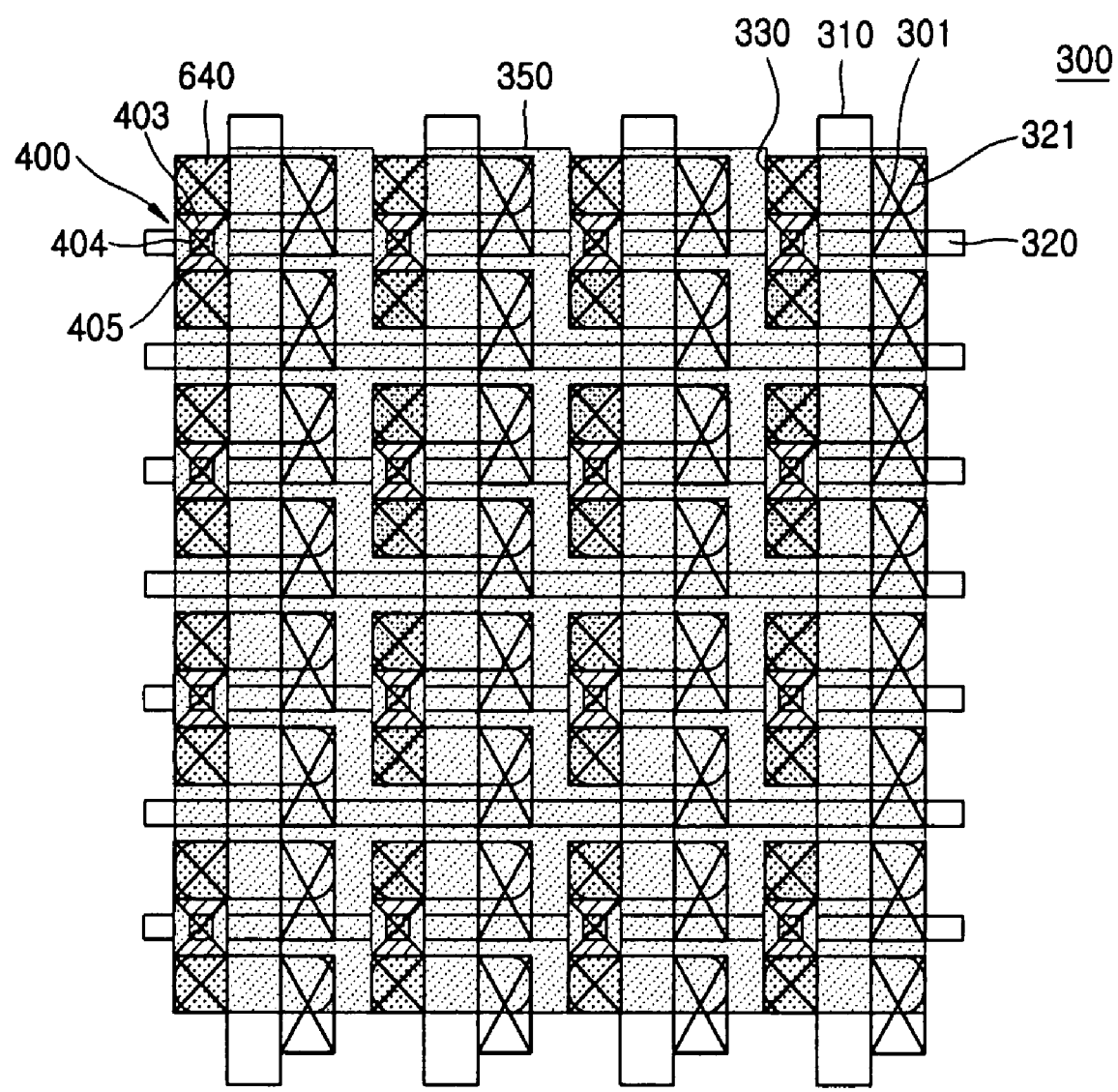
Figure 15:
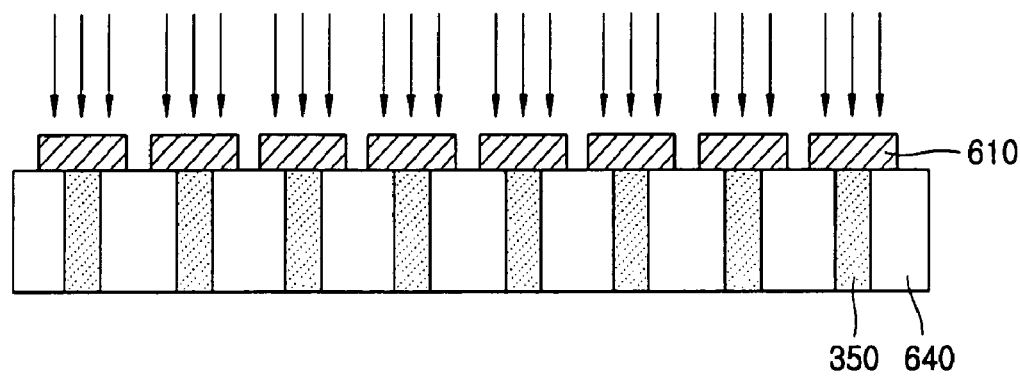
FIG. 15 through 18 are schematic cross-sectional views for explaining the process of forming an array of probes used in a resistive memory device according to an exemplary embodiment of the present invention.
Figure 17:
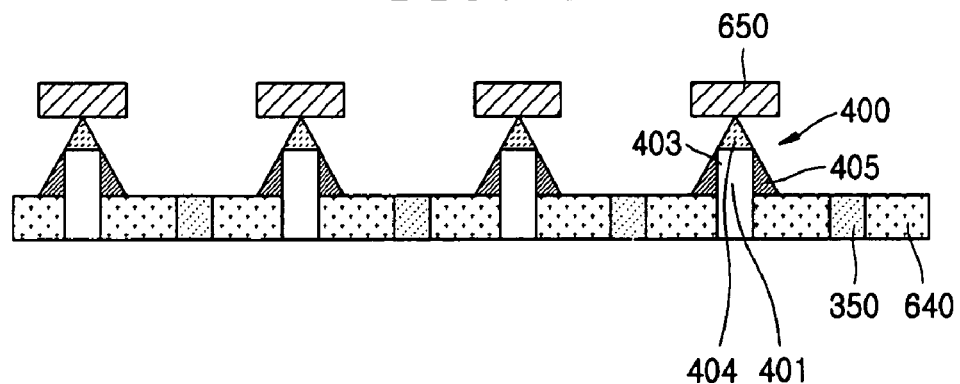
Figure 18:
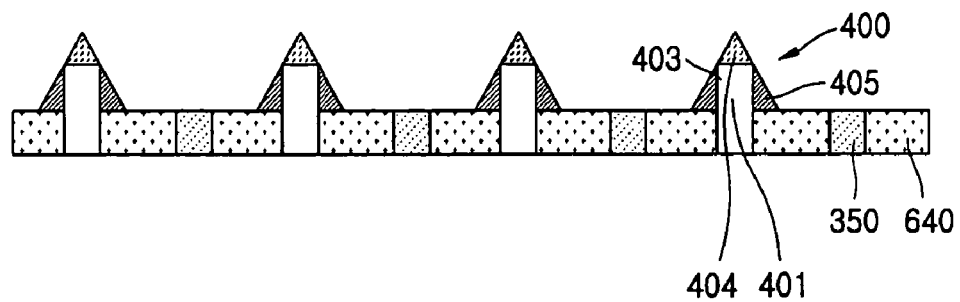

Referring to FIGS. 14, 17 and 18, the portions of the silicon layer 350 exposed through the tip masks 650 are isotropically etched to form the probes 400 with tips pointing upward. When the tip masks 650 are square, the probes 400 formed using isotropic etching will have the shape of tetragonal cones. The tips of the probes 400 are resistive regions 404, which correspond substantially to portions of the impurity diffusion regions 641 (see FIG. 16). The first and second electrode regions 403 and 405 which are formed to face to each other on the inclined surfaces of the probes 400 correspond to portions of the impurity regions 640.

The isotropic etching may be performed until a layer below the silicon layer 350 is exposed. Alternatively, a portion of the silicon layer 350 may be allowed to remain after the isotropic etching. When some of the silicon layer 350 remains, the first and the second electrode regions 403 and 405 are respectively electrically connected to the cell plugs 330 through the impurity regions 640 which remain below the first and the second electrode regions 403 and 405.

As illustrated in FIG. 14, the first electrode regions 403 are electrically connected to the active regions 301 through the cell plugs 330 to contact the selection transistors. Thus, the first electrode regions 403 are electrically connected to the bit lines 320 through the bit line plugs 321 according to control or switching of the word lines 310 by the selection transistors. The second electrode regions 405 contact the other selection transistors through the other cell plugs 330 to be electrically connected to the other adjacent bit lines 320 through the other bit line plugs 321 according to the control or switching by the same word lines 310. In such an interconnection structure, by selecting one of the word lines 310, a row of probes 400 connected to the word line 310 is selected. Then, a pair of bit lines 320 which are respectively connected to the first and the second electrode regions 403 and 405 select one of the probes 400 in the selected row. The bit lines 320 are used as two terminals for the probes 400, to apply voltages to the selected probe 400.

As explained above, the resistive memory device according to an exemplary embodiment of the present invention is formed by binding the second substrate 300 (see FIG. 1) having the array of probes 400 to the first substrate 100 having the ferroelectric layer 200.

Figure 19:
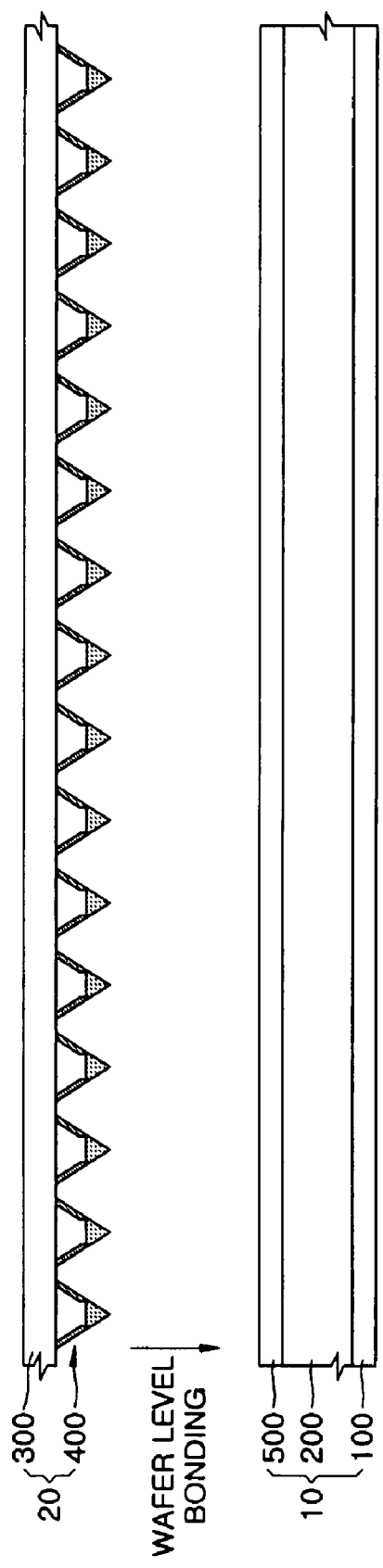
FIG. 19 is a schematic view for explaining the process of wafer level bonding to form a resistive memory device according to an exemplary embodiment of the present invention.

FIG. 19 is a schematic view for explaining the process of wafer level bonding to form a resistive memory device according to an embodiment of the present invention.

Referring to FIG. 19, a probe part 20 having an array of probes 400 formed on a second substrate 300 is bound to a memory part 10 having a ferroelectric layer 200 formed on a first substrate (not shown) by wafer level bonding. During the wafer level bonding, the tips of the probes 400 penetrate a binding layer 500 comprising a layer of polymer or polymer-like material formed on the ferroelectric layer 200, such that the tips of the probes 400 contact or are adjacent to the surface of the ferroelectric layer 200. Then, the polymer layer of the binding layer 500 is cured to fix the probes 400 on or adjacent to the ferroelectric layer 200.

As described above, the present invention provides a memory device comprising resistive probes and a memory layer, which is a ferroelectric layer. The memory device has no mechanical parts, and thus has the high impact and abrasion resistance required for use in reliable portable electronic products.

Since the probe array is bound to the ferroelectric layer by wafer level bonding using the binding layer, the binding layer can efficiently shield the ferroelectric layer from charged particles and moisture. Furthermore, since the ferroelectric layer is deposited on a separate wafer, it can be deposited at a high temperature, thus improving its properties and reliability. The integration degree and writing density of the memory device depend on the density of probes in the probe array, and thus, the memory according to the present invention can guarantee a higher writing density than conventional FeRAM devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A resistive memory device comprising:
a memory part having a bottom electrode and a ferroelectric layer sequentially formed on a first substrate;
a probe part having an array of resistive probes arranged on a second substrate, the resistive probes comprising tips which face the ferroelectric layer such that they can write and read data on the ferroelectric layer; and
a binding layer which grabs and fixes the resistive probes on the ferroelectric layer, wherein each of the resistive probes comprises:
a resistive region at the tip, a resistance of which changes according to the direction of remnant polarization in a domain of the ferroelectric layer corresponding to the tip; and
a first electrode region and a second electrode region, which are separated from each other on inclined surfaces of the probe and have the resistive region interposed therebetween, the first and the second electrode regions being used to detect the resistance of the resistive region when reading data,
wherein the resistive region is disposed inside the binding layer for the binding layer to grab and fix the resistive probes on the ferroelectric layer, and
wherein the first and second electrode regions are not disposed inside the binding layer
wherein the binding layer comprises at least one of a polymer layer and adhesive resin that insulate and shield the ferroelectric layer from charged particles and atmospheric humidity.

2. The resistive memory device of claim 1, wherein each of the resistive probes has a body in the shape of one of a cone and a polygonal cone, containing silicon doped with a first impurity, and
the first and the second electrode regions comprise regions doped with a second impurity of the opposite conduction type to the first impurity, on the separated inclined surfaces.

3. The resistive memory device of claim 2, wherein the resistive region comprises a region doped with the second impurity at a lower concentration than the first and second electrode regions.

4. The resistive memory device of claim 1, wherein the probe part further comprises: interconnections which are respectively connected to the first and second electrode regions, are formed behind the probe array, and function as terminals for selecting one of the resistive probes and applying a current to the selected resistive probe.

5. The resistive memory device of claim 1, wherein the probe part further comprises:
bit lines which are respectively connected to the first and second electrode regions and formed behind the probe array; and
selection transistors which control the application of a current to the bit lines.

6. A resistive memory device comprising:
a memory part having a bottom electrode and a ferroelectric layer sequentially formed on a first substrate;
a probe part having an array of resistive probes arranged on a second substrate, the resistive probes comprising tips which face the ferroelectric layer such that they can write and read data on the ferroelectric layer,
wherein each of the resistive probes has a body in the shape of one of a cone and a polygonal cone, containing silicon doped with a first impurity, and comprises;
a resistive region at the tip, a resistance of which changes according to the direction of remnant polarization in a domain of the ferroelectric layer corresponding to the tip;
a first electrode region and a second electrode region, which are separated from each other on inclined surfaces of the body and have the resistive region interposed therebetween, the first and the second electrode regions being used to detect the resistance of the resistive region when reading data, and the resistive region comprising a region doped with a second impurity at a lower concentration than the first and second electrode regions;
bit lines which are respectively connected to the first and second electrode regions, are formed behind the probe array, and function as terminals for selecting one of the resistive probes and applying a current to the selected resistive probe; and
selection transistors which control the application of a current to the bit lines; and
a binding layer which grabs and fixes the resistive probes on the ferroelectric layer,
wherein the resistive region is disposed inside the binding layer for the binding layer to grab and fix the resistive probes on the ferroelectric layer, and
wherein the first and second electrode regions are not disposed inside the binding layer
wherein the binding layer comprises at least one of a polymer layer and adhesive resin that insulate and shield the ferroelectric layer from charged particles and atmospheric humidity.

* * * * *